(12) United States Patent
Dame

(10) Patent No.: US 7,847,183 B2
(45) Date of Patent: Dec. 7, 2010

(54) THREE DIMENSIONAL PHOTO VOLTAIC MODULES IN AN ENERGY RECEPTION PANEL

(76) Inventor: Casey Dame, 160 Theodore Fremd Rd. # A12, Rye, NY (US) 10580

( * ) Notice: Subject to any disclaimer, the term of this patent is extended or adjusted under 35 U.S.C. 154(b) by 192 days.

(21) Appl. No.: 12/210,819

(22) Filed: Sep. 15, 2008

(65) Prior Publication Data

US 2009/0071531 A1 Mar. 19, 2009

Related U.S. Application Data

(60) Provisional application No. 60/971,941, filed on Sep. 13, 2007.

(51) Int. Cl.
*H01L 31/042* (2006.01)
*H01L 31/048* (2006.01)

(52) U.S. Cl. ............... 136/249; 136/251; 136/244; 136/243; 136/259; 438/57

(58) Field of Classification Search .......... 136/243–265
See application file for complete search history.

(56) References Cited

U.S. PATENT DOCUMENTS

| 4,089,705 A | 5/1978 | Rubin |
| 4,152,174 A | 5/1979 | Ludlow |
| 4,158,133 A * | 6/1979 | Spaeth et al. ........... 250/214 R |
| 4,427,839 A | 1/1984 | Hall |
| 4,453,030 A | 6/1984 | David |
| 4,620,364 A | 11/1986 | Landis |
| 4,626,613 A | 12/1986 | Wenham |
| 5,081,049 A | 1/1992 | Green |
| 5,466,301 A | 11/1995 | Hammerbacher |
| 5,782,993 A | 7/1998 | Ponewash |
| 6,313,397 B1 | 11/2001 | Washio |
| 6,541,696 B2 | 4/2003 | Washio |
| 6,686,533 B2 | 2/2004 | Baum |
| 6,689,949 B2 | 2/2004 | Ortabasi |
| 7,128,975 B2 | 10/2006 | Inomata |
| 2003/0098060 A1 | 5/2003 | Yoshimi |
| 2004/0074490 A1 | 4/2004 | Mills |
| 2004/0231717 A1 | 11/2004 | Greiff |
| 2004/0238025 A1 * | 12/2004 | Shingleton ............. 136/246 |
| 2005/0072461 A1 | 4/2005 | Kuchinski |
| 2005/0081908 A1 | 4/2005 | Stewart |
| 2006/0180194 A1 | 8/2006 | Mitsunari |
| 2006/0185713 A1 | 8/2006 | Mook |
| 2006/0272698 A1 | 12/2006 | Durvasula |
| 2007/0074756 A1 | 4/2007 | Yagiura |
| 2007/0084505 A1 | 4/2007 | Zaidi |
| 2007/0169804 A1 * | 7/2007 | Nakata ................. 136/250 |

* cited by examiner

*Primary Examiner*—Jennifer K Michener
*Assistant Examiner*—Jayne Mershon
(74) *Attorney, Agent, or Firm*—Dykema Gossett PLLC

(57) ABSTRACT

An apparatus for receiving energy is disclosed. The apparatus comprises a support base and a plurality of cells. The support base comprises an electric terminal. The plurality of cells are mounted to the support base. Further, each of the plurality of cells is electrically connected to the electric terminal disposed on the support base. Finally, each of the plurality of cells is oriented in a non-parallel relationship with each neighboring cell.

16 Claims, 4 Drawing Sheets

THREE DIMENSIONAL PHOTO VOLTAIC MODULES IN AN ENERGY RECEPTION PANEL

CROSS REFERENCE To RELATED APPLICATION

The Present Invention claims priority to previously-filed U.S. Provisional Patent Application No. 60/971,941, filed on Sept. 13, 2007.

FIELD OF THE PRESENT INVENTION

The Present Invention relates to the efficient development of solar energy, and more particularly, to an apparatus for increasing the efficiency of photo voltaic cells in a solar energy reception panel.

BACKGROUND OF THE PRESENT INVENTION

Photo voltaic systems, which are developed and utilized for generating electric power through the conversion of radiant energy—preferably solar energy, although other sources of radiant or other energy may be applicable—into electricity, are currently known. In such systems, the entire structure of which is sometimes known as an energy receiving panel, a substantially flat portion, or support base, is placed on top of a stationary structure, such as the roof of a building. Alternatively, the support base may be placed on a movable structure, such as a calculator, watch, automobile, etc.

Additionally, energy receiving panels can be used with "tracking systems"—an ancillary system used to orient the energy receiving panels according to the changing position of the sun, or in line with the highest and/or brightest energy source, during the course of the day or other temporal period.

Within the support base is disposed the circuitry and/or other similar devices by which the radiant energy—received, or absorbed, by the energy receiving panels from the energy source—is converted into electricity. Alternatively, this circuitry and/or these devices may be disposed in a remote location; in which case, they would be in electrical communication with the support base.

Coupled to the support base of the energy receiving panel are a plurality of energy receiving cells. Each energy receiving cell, which is traditionally substantially rectangular in nature, is disposed in a parallel planar relationship with each other and with the support base. As a result of the static physical disposition of the energy receiving cells, efficiency of absorption of energy suffers as the energy source moves above the energy receiving panels, i.e., as the sun rotates from east to west above the energy receiving panels. Further, the "flatness," or planar nature, of the energy receiving cells limits the amount of surface area that is directly exposed to the energy source at any given point in time. Consequently, when the efficiency of absorption of the energy receiving cells suffers, coupled with a less than optimum time of direct exposition to radiant energy, the amount of generated electricity is reduced. Thus, the use of such energy receiving panels for the generation of electricity has been mainly limited by the poor efficiency and high exploitation costs of the energy receiving cells, as well as the reduced utility of the surface area due to the "flatness" of the energy receiving cells.

Thus, it would be desirable to provide an improved energy receiving panel which provides a greater efficiency of absorption, resulting in a greater generation of electricity, by overcoming the disadvantages in the currently-used devices.

SUMMARY OF THE PRESENT INVENTION

The Present Invention overcomes the disadvantages in the currently-used devices by providing an apparatus geared towards, inter alia, the increased absorption of radiant energy from an energy source. In turn, the Present Invention allows for a greater amount of electricity to be generated. The Present Invention achieves this by, inter alia, eliminating the "flatness" of the present devices and provides a three dimensional absorption means. As a result, not only is the potentially absorbable surface area increased (while retaining the same length and width dimensions) vis-à-vis currently-used devices, but the Present Invention allows for the direct exposure with the light source for a much greater amount of time than currently-used devices.

To this end, an apparatus for receiving radiant energy is disclosed. The apparatus comprises a support base and a plurality of energy receiving cells. The support base comprises an electric terminal. The plurality of energy receiving cells are mounted to the support base. Further, each of the plurality of energy receiving cells is electrically connected to the electric terminal disposed on the support base. Finally, each of the plurality of energy receiving cells is oriented in a non-parallel relationship with each neighboring energy receiving cell.

In essence, the Present Invention is able to provide a more efficient means of receiving and absorbing energy than the energy receiving cells currently in use.

DETAILED DESCRIPTION OF THE PREFERRED EMBODIMENTS

Figure 1:
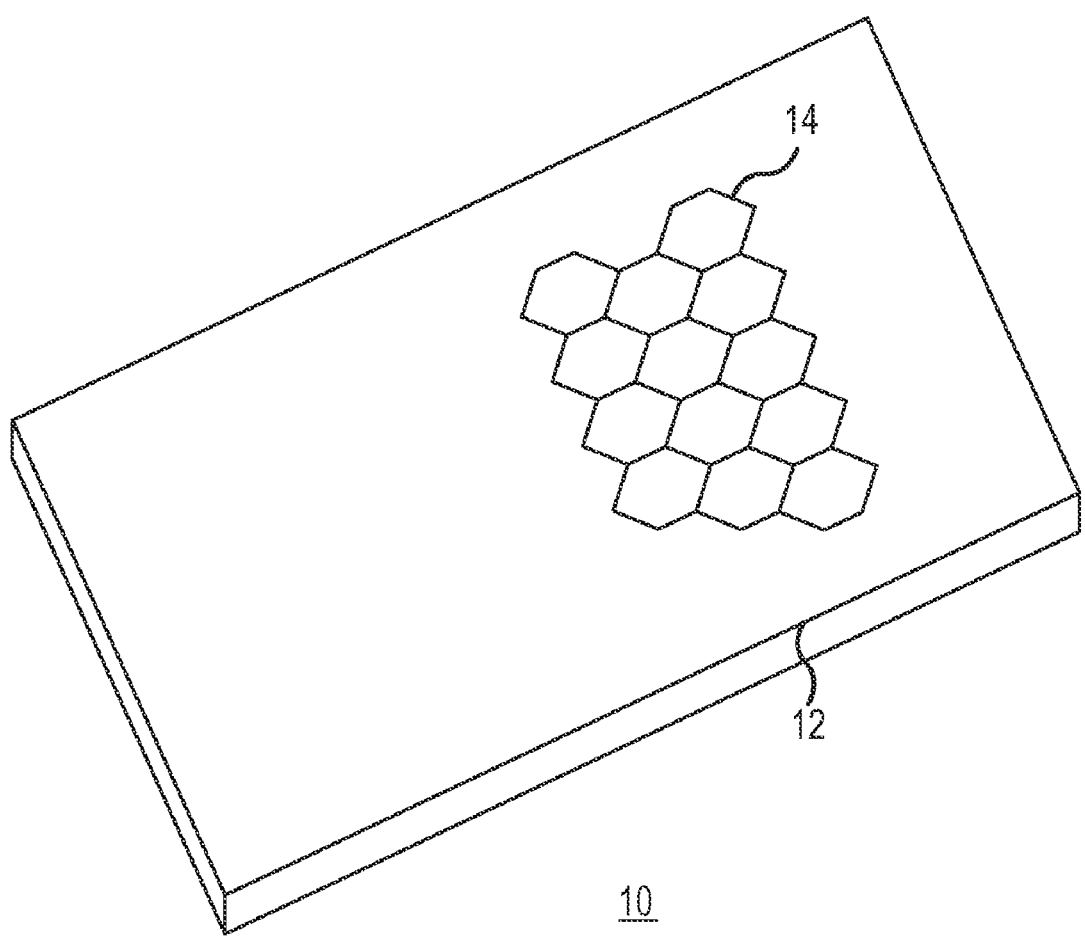
FIG. 1 illustrates a perspective view of the energy receiving panel, manufactured in accordance with the tenets and teachings of the Present Invention.

The illustrated embodiments of the Present Invention are directed to an apparatus for receiving radiant energy from a radiant energy source, such as the sun or any other radiant energy source, and having the ability to convert the received energy into electricity.

The technology of photo voltaics is an electricity-generating technology in which energy is absorbed and converted into electrical power. In its most common form, photo voltaics provides a method for generating electrical power by using photo voltaic modules, or energy receiving cells, often electrically coupled in plurality, as photo voltaic arrays, and configured to receive and convert energy from the sun (or any other radiant energy source) into electricity. A plurality of energy receiving cells structurally coupled together forms an energy receiving panel. Further, the photo voltaic device within each energy receiving cell receives, or absorbs, the energy, generally through the transduction of radiant energy through the photo voltaic module. In turn, the energy receiving cell generates electricity.

Energy receiving cells produce Direct Current ("DC") electricity from radiant energy, which can be used for a variety of electrical uses, such as to power electrical and/or electronic equipment or to recharge a battery. Although the initial practical application of photo voltaics was to power orbiting satellites and other spacecraft—as well as pocket calculators and wrist watches, today the majority of solar energy receiving panels are used for grid-connected power generation. Further, stand-alone power generation, such as that necessary for an automobile, have shown a desire for photo voltaics. In these case, an inverter may be required to convert the DC electricity to the Alternating Current ("AC") electricity.

Energy receiving cells require protection from the environment and are generally packaged, or encased, in a transparent material, usually, for example behind a glass—or transparent plastic—sheet. Additionally, due to the layout of the energy receiving cells, as set forth below, the material would also preferably be highly reflective and refractive, with a preference to a material having a reflection coefficient that coincides with the absorption rate of the energy receiving cells, so as to deflect any heat energy from the energy source toward a neighboring energy receiving cell. In this manner, heat energy reflected from one cell may be absorbed by another cell, thereby increasing the efficiency of the energy receiving cells of the Present Invention. Alternatively, a reflective coating placed on the inside of the material would reflect any radiant energy from the energy receiving cells back to that particular cell. Finally, in lieu of a protective material, a protective coating, having all the attributes described above, may be placed directly on each energy receiving cell.

When more power is required than a single energy receiving cell can deliver, pluralities of energy receiving cells are electrically connected together to form energy receiving panels. Further, multiple energy receiving panels can be arranged in arrays to address a further need for power.

Structure-integrated photo voltaics are increasingly being incorporated into new buildings as a principal or ancillary source of electrical power, and are one of the fastest growing segments of the photo voltaic industry. Typically, an array of receiving energy panels is incorporated into the roof or walls of a building, and, in fact, roof tiles with integrated energy receiving cells can now be purchased. Additionally, these arrays can include tracking devices to follow the radiant energy source. These arrays can also be retrofitted into existing buildings; in this case they are usually fitted on top of the existing roof structure. Alternatively, an array can be located separately from the building but connected by cable to supply power for the building. Finally, where a building is at a considerable distance from a public electricity supply (or grid)—such as in remote or mountainous areas, photo voltaics may be the preferred possibility for generating electricity, or, alternatively, may be used together with wind, diesel generators and/or hydroelectric power. In such off-grid circumstances, batteries may be used to store the electric power.

Referring now to the Figures, in which like elements are represented by the same reference numerals, an energy receiving panel is illustrated as reference numeral 10. Energy receiving panel 10 generally comprises support base 12 and a plurality of energy receiving cells 14.

Support base 12, as illustrated, acts as the supporting structure for energy receiving panel 10. Further, support base 12 also includes any and all currently-known electric connective devices to convert the radiant energy received and absorbed by plurality of energy receiving cells 14 into electricity.

Support base 12 is intended to be affixed or disposed on a structure so that support base 12, and consequently energy receiving panel 10, will be under the rays of the radiant energy source for any period of time during the course of a normal day. Additionally, it is intended that energy receiving panel 10 be disposed on a structure, such as a tracking device, allowing for a constantly changing tilt, in such a manner so as to maximize the amount of radiant energy received by energy receiving cells 14.

Each of plurality of energy receiving cells 14 is illustrated as being of a hexagonal "footprint," as disposed on support base 12. However, although the "footprint" of each energy receiving cell 14 is hexagonal, the physical shape of each energy receiving cell 14 is preferred to be cubic, with each side of each energy receiving cell 14 being in a perpendicular relationship with each neighboring side.

Figure 2:
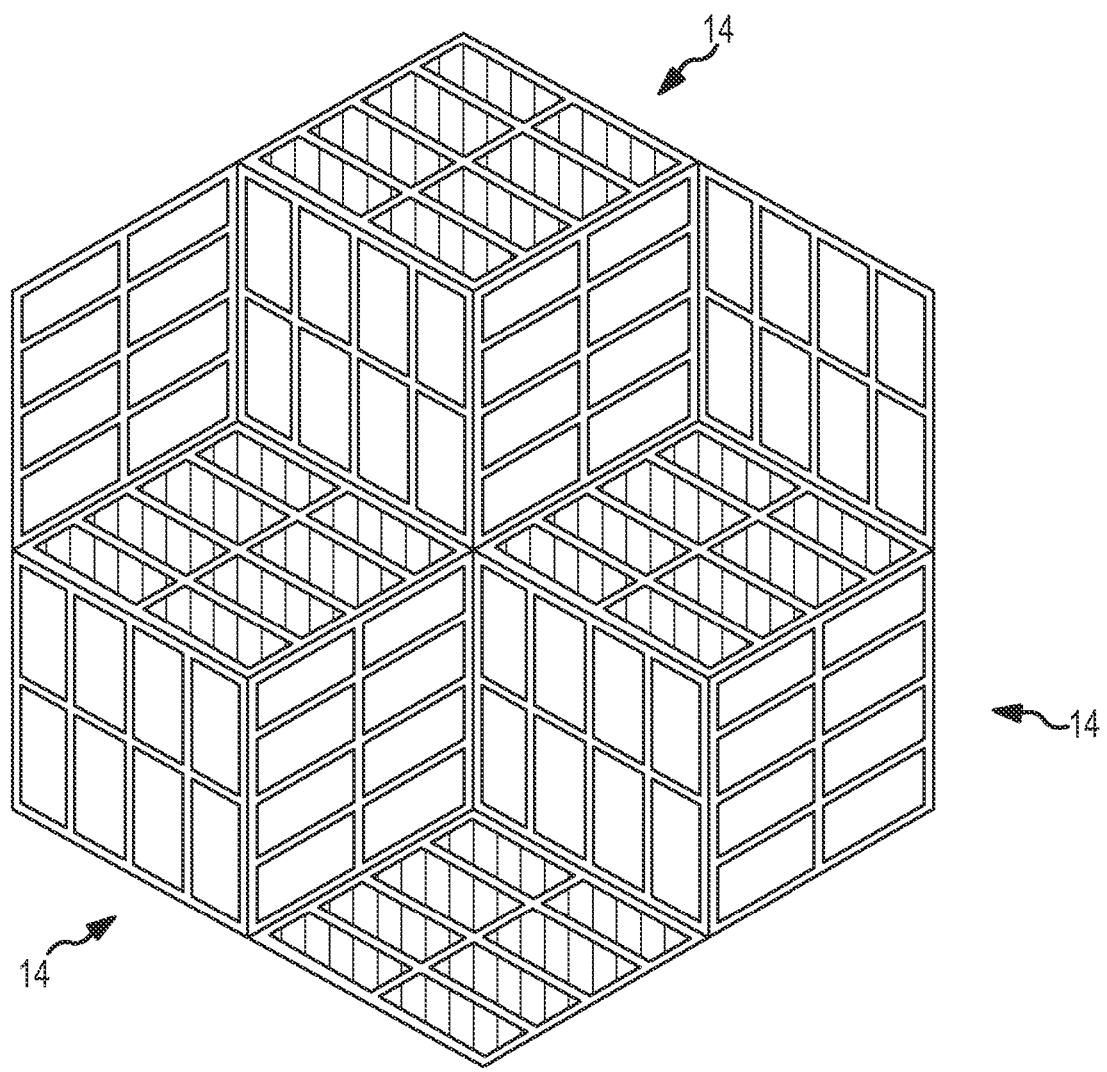
FIG. 2 illustrates a plurality of energy receiving cells, used in conjunction with the solar energy receiving panel of FIG. 1.

FIG. 2 provides a detailed illustration of a plurality of energy receiving cells 14. Referring to FIG. 2, it is illustrated that each energy receiving cell 14 is angled such that three sides are able to receive and absorb radiant energy from the radiant energy source. By providing a three dimensional receptor, the Present Invention is able to provide a more efficient means of receiving and absorbing radiant energy than the energy receiving cells currently in use. A discussion of the experimentation which resulted in the design of the Present Invention is provided, infra.

Although the general design of each energy receiving cell 14 in accordance with the tenets and teachings of the Present Invention is that of a cube, each of plurality of energy receiving cells 14 may alternatively comprise any suitable polygonal shape having an interlocking footprint, provided that such suitable shape be able to fit within the teachings and tenets of the Present Invention, including the ability to provide increased efficiency. Further, the surface of energy receiving cell 14 may further comprise either a concave or convex surface.

In testing the Present Invention, the basic premise of the operation of currently-known energy receiving cells were accepted. That is, energy receiving cells are currently placed flat on a support base, which is then disposed on the top of a structure or tracking device such that it will receive radiant energy from a radiant energy source. Notably, the energy receiving cells in use today are substantially flat objects, in that, although they are obviously three dimensional, the sides of the cells do not provide a surface through which radiant energy may be absorbed.

In accordance with the teachings and tenets of the Present Invention, an energy receiving cell in the shape of an orthogonal projective geometry was tested. More specifically, a regular hexahedron, such as a cube, was tested. Based on the testing, it was found that, if the cube was tilted in a manner such that no side of the cube was parallel to the support base, an increase in the efficiency of radiant energy reception would be realized.

Another aspect concerning the Present Invention involves the property that the heating of an energy receiving cell itself causes a loss of energy output. To this end, additional testing indicated that, due to the nature of the design of the cubes, including the perpendicular relationship of the sides thereof, the surface (i.e., that which is absorbent of the output of the energy source) of each energy receiving cell 14 remained cooler than the surfaces of the flat cells currently in use in the industry. Further, the reduced temperature of the surface appears to remain also as compared to more acute-angled configurations. Consequently, the design contemplated by the Present Invention, including the angular relationship described herein, in light of the fact that the loss of energy output is reduced, results in a more efficient configuration. This result is based on three principles. First, each energy receiving cell 14 of the Present Invention has a lower profile due to its angular configuration. Consequently, each cell 14 is less exposed to heat. Second, the properties of reflection cause heat to be distributed among the multiple surfaces of the collective energy receiving cells 14. Third, due to the angular placement of each energy receiving cell 14, heat is actually reflected away from the surfaces thereof (and, in turn, toward multiple neighboring surfaces). In this regard, and due to the inherent properties thereof, each cell 14 possesses a reflective property that causes an energy source to reflect off multiple surfaces, thus increasing the probability to generate energy therefrom.

To provide the maximum increase in efficiency, it was determined that the use of a plurality of cubes—in particular, a plurality of six-sided regular hexahedrons in which all sides are of equal length, width and area, and all angles are of equal length—can be disposed in a manner such that a tiled, generally perpendicular plane is formed, although, as illustrated in the Figures, only one half of each hexahedron is exposed to the radiant energy source. Also referred to as an axonometric projection, the disposition of the cubes in this manner represents a visual representation of a three-dimensional object in two dimensions in Euclidian space.

Figure 3:
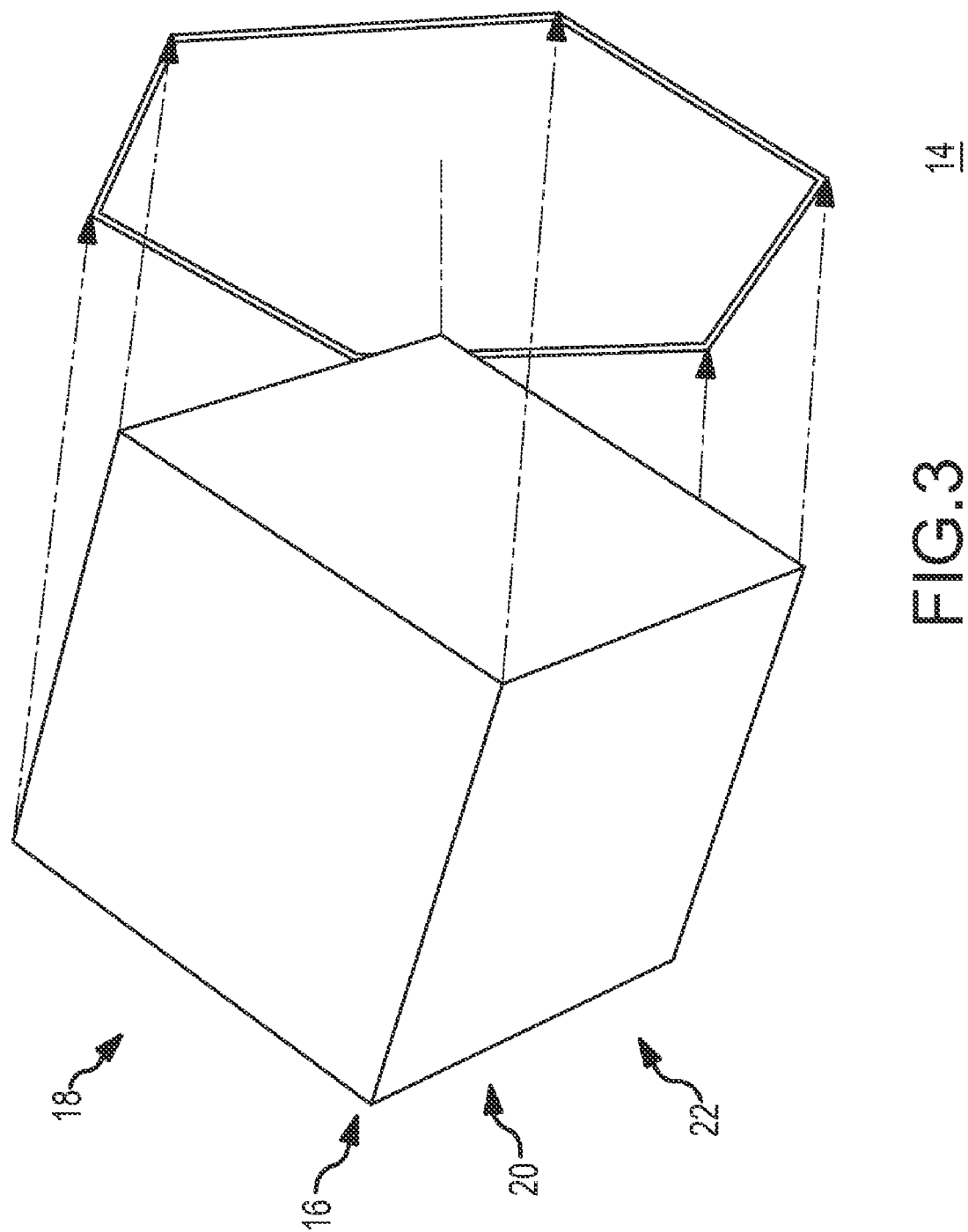
FIG. 3 illustrates a perspective view of one energy receiving cell of FIG. 2.

One cell, used in this manner, is illustrated in FIG. 3, and referenced as numeral 14. Referring to FIG. 3, it is illustrated that apex 16 of cell 14 is disposed at the exact center of the illustrated object. Spawning from apex 16 are first, second and third sides 18, 20, 22. Each of first, second and third sides 18, 20, 22 of cell 14 are of the same size, as referenced above. It is understood that the "footprint" of cell 14 resembles a hexagonal shape.

Further, each of first, second and third sides 18, 20, 22 of cell 14 are comprised of any currently-known material which allows each side to receive solar rays. Collectively, each of first, second and third sides 18, 20, 22 of cell 14 represent the three dimensional surface area that receives the solar rays. Additionally, the outline edges of cell 14 of FIG. 3 represents the aforementioned axonometric projection.

Figure 4:
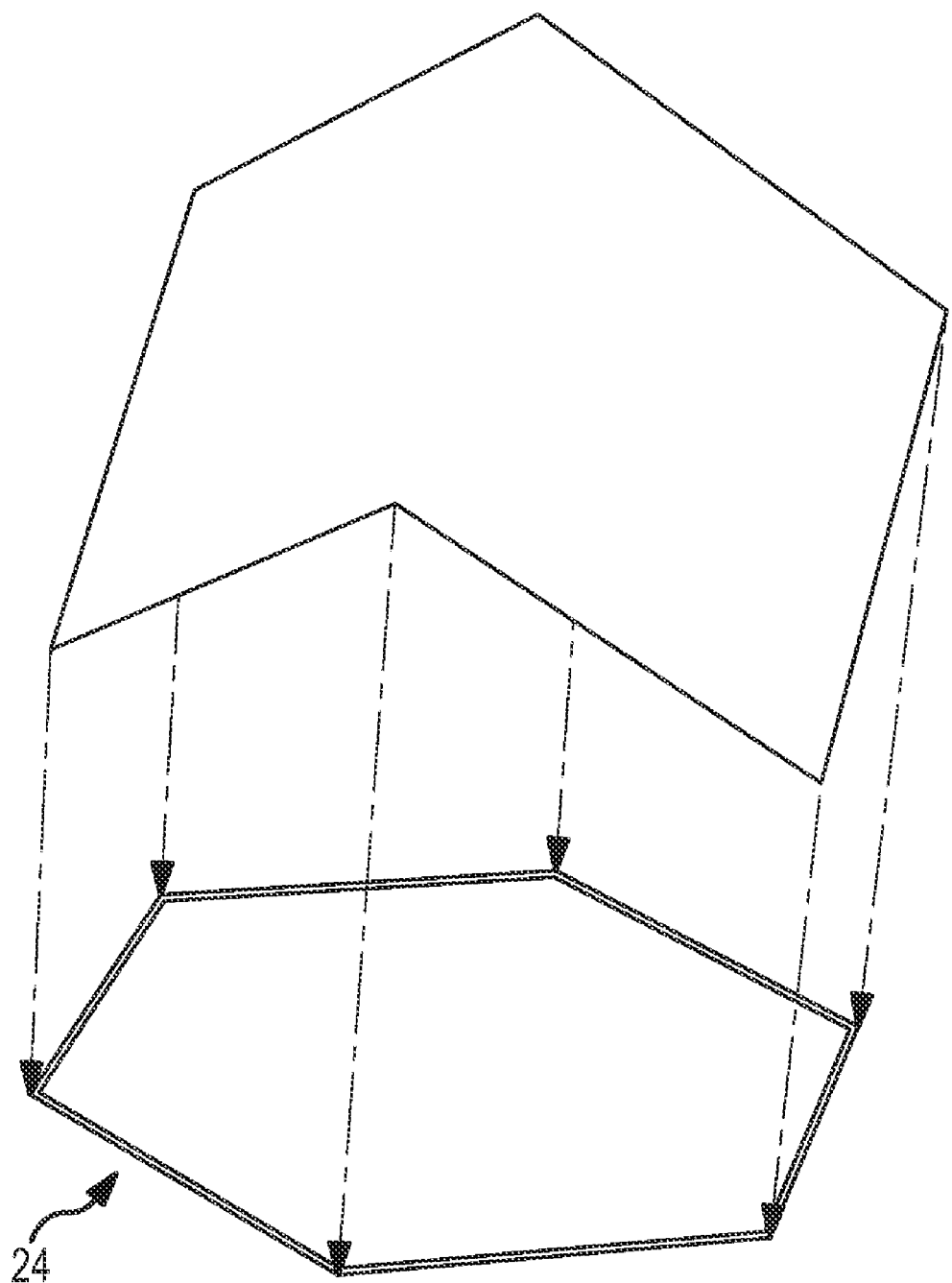
FIG. 4 illustrates a footprint of the energy receiving cell of FIG. 3.

Further, it was determined that the process by which cell 14 is "turned" so that it is not flush against support base 12 increases the surface area that is exposed to radiant energy. This is due, primarily, to the geometric nature of a cube versus that of a hexagon, which, as stated above, is the "footprint" that results from the "turning" of cell 14 in the manner illustrated in FIG. 4. A representation of this "footprint" is illustrated in FIG. 4 at reference numeral 24.

The general surface area of a cube is represented by the formula:

$$Area = 6a^2$$

where a represents the length of an edge. Further, since, according to the Present Invention, the portions of the cube that would be visible is half of the total surface area of the cube. Thus, the surface area of the cube that is intended for use in the Present Invention is represented by the formula:

$$Area = \frac{6a^2}{2} = 3a^2$$

By contrast, the general surface area of a hexagon is represented by the formula:

$$Area = \frac{3\sqrt{3}}{2}b^2 \approx 2.598076211b^2$$

where b represents the length of a hexagon. In the initial aspect of this comparison, it is assumed that a is constant for both the cube and the hexagon. If, for example, a and b equal 1 (i.e., the length of the cube edge is equal to the length of the hexagonal side), then the surface area of the visible portions of the cube would be:

$$Area = 3a^2 = 3$$

And the surface area of the visible portion of the hexagon would be:

$$Area = \frac{3\sqrt{3}}{2}b^2 \approx 2.598076$$

Therefore, the surface area of the cube is approximately 13.40% larger than that of the hexagon. This occurs while, nevertheless, taking up the same "footprint" on the solar energy receiving panel as the hexagon.

However, in actuality, when dealing with three dimensional space, which is necessary when dealing with a projection of the cube, i.e., an axonometric projection, there cannot be a 1:1 ratio between the length, a, of the cube and the length, b, of the hexagon. Rather, a side length of the resultant hexagonal "footprint" from an axonometric cube projection would be approximately 0.816497. Thus, the revised surface area of a hexagon would be:

$$Area = \frac{3\sqrt{3}}{2}b^2 = 1.732049$$

The visible surface area of the cube would remain at 3. As a result of the teachings and tenets of the Present Invention, an increase in the surface area of the "turned" cube compared to the "revised" hexagon described above comprises approximately 42.27%. In other words, the visible cube space is approximately 42.27% greater than that of the surface area of a flat hexagon.

As a result of the increase in surface area compared with that of a flat hexagon, the Present Invention would provide an increase in surface area compared to that of currently-known energy receiving panels. Consequently, an increase in the absorption of radiant energy was also measured. Due to the angle of incident that results from the fact that the energy receiving panels of the Present Invention are disposed on the support base in a axonometric projection, there is a loss of efficiency. However, the loss of efficiency due to the angle of incident has been measured at approximately 7-10%, meaning that the solar energy receiving panels of the Present Invention operate at approximately 90-93% efficiency. This can even be reduced, as mentioned above, through the use of a refractive coating on the energy receiving cells.

The disclosed Present Invention provides a photo voltaic array for use in a energy reception panel that increased the efficiency of current devices. It should be noted that the above-described and illustrated embodiments and preferred embodiments of the Present Invention are not an exhaustive listing of the forms the Present Invention might take; rather, they serve as exemplary and illustrative embodiments of the Present Invention as presently understood. Many other forms of the Present Invention exist and are readily apparent to one having ordinary skill in the art.

What is claimed is:

1. An apparatus for receiving radiant energy from a radiant energy source comprising:
    a support base, the support base comprising an electric terminal;

a plurality of cells mounted to the support base, each of the plurality of cells having a plurality of sides and being electrically coupled to the electric terminal;

wherein each of the plurality of cells is oriented in a non-parallel relationship with each neighboring cell, each cell is angled such that at least three sides of each cell are configured to receive radiant energy from said radiant energy source, and the angling of each cell provides a footprint relative to said support base that is different than the shape of the cell.

2. The apparatus of claim 1, wherein each of the plurality of cells is mounted in a perpendicular relationship with each neighboring cell.

3. The apparatus of claim 2, wherein the radiant energy source is the sun.

4. The apparatus of claim 2, wherein each of the plurality of cells is encased by a protective material.

5. The apparatus of claim 4, wherein the protective material is reflective.

6. The apparatus of claim 4, wherein the protective material is refractive.

7. The apparatus of claim 2, wherein each of the plurality of cells further includes a protective coating disposed thereon.

8. The apparatus of claim 7, wherein the protective coating is reflective.

9. The apparatus of claim 7, wherein the protective coating is refractive.

10. The apparatus of claim 2, further comprising a tracking device disposed in communication with the support base.

11. An apparatus for generating electricity from a radiant energy source comprising:

a support base, the support base comprising an electric terminal; and a plurality of cells mounted to the support base, each of the plurality of cells having at least three sides and being electrically coupled to the electric terminal;

wherein each of the plurality of cells is oriented in a non-parallel relationship with each neighboring cell, each cell is angled and configured to receive radiant energy from said radiant energy source for conversion into electricity, and the angling of each cell provides a footprint relative to said support base that is different than the shape of the cell.

12. The apparatus of claim 11, wherein each of the plurality of cells is mounted in a perpendicular relationship with each neighboring cell.

13. The apparatus of claim 11, wherein each cell provides a hexagonal footprint relative to the support base.

14. The apparatus of claim 11, wherein each of the plurality of cells is configured to be turned so that it is not flush against the support base.

15. The apparatus of claim 14, wherein the surface area of each turned cell receives approximately 42.27% more radiant energy than a similarly sized and shaped cell that is disposed flush against the support base.

16. The apparatus of claim 11, wherein each of the plurality of cells are arranged substantially adjacent to a neighboring cell to substantially eliminate gaps therebetween.

* * * * *